(12) United States Patent
Roohparvar

(10) Patent No.: US 6,240,023 B1
(45) Date of Patent: *May 29, 2001

(54) METHOD FOR EFFICIENTLY EXECUTING SOFT PROGRAMMING OF A MEMORY BLOCK

(75) Inventor: Frankie Fariborz Roohparvar, Cupertino, CA (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/032,189

(22) Filed: Feb. 27, 1998

(51) Int. Cl.⁷ .................................................. G11C 16/04
(52) U.S. Cl. .............................. 365/185.3; 365/185.18; 365/185.28; 365/185.29
(58) Field of Search ........................... 365/185.3, 185.18, 365/185.28, 185.29

(56) References Cited

U.S. PATENT DOCUMENTS

| 5,412,603 | 5/1995 | Schreck et al. ............ 365/189.01 |
| 5,535,164 | * 7/1996 | Adams et al. ............ 365/201 |
| 5,568,426 | 10/1996 | Roohparvar et al. ............ 365/185.22 |
| 5,576,992 | * 11/1996 | Mehrad ............ 365/185.28 |
| 5,600,593 | * 2/1997 | Fong ............ 365/185.29 |
| 5,615,159 | 3/1997 | Roohparvar ............ 365/201 |
| 5,619,453 | 4/1997 | Roohparvar et al. ............ 365/185.33 |
| 5,627,784 | 5/1997 | Roohparvar ............ 365/189.01 |
| 5,636,166 | 6/1997 | Roohparvar ............ 365/194 |
| 5,642,311 | 6/1997 | Cleveland et al. ............ 365/185.3 |
| 5,657,268 | 8/1997 | Truong et al. ............ 365/185.13 |
| 5,677,879 | 10/1997 | Roohparvar et al. ............ 365/185.22 |
| 5,680,350 | 10/1997 | Lee ............ 365/185.24 |
| 5,699,298 | * 12/1997 | Shiau et al. ............ 365/185.18 |
| 5,745,410 | * 4/1998 | Yiu et al. ............ 365/185.3 |
| 5,751,944 | 5/1998 | Roohparvar et al. ............ 395/183.18 |
| 5,764,568 | 6/1998 | Chevallier ............ 365/185.03 |
| 5,774,400 | 6/1998 | Lancaster et al. ............ 365/185.3 |
| 5,781,477 | 7/1998 | Rinerson et al. ............ 365/185.29 |
| 5,790,459 | 8/1998 | Roohparvar ............ 365/185.21 |
| 5,801,985 | 9/1998 | Roohparvar et al. ............ 365/185.01 |
| 5,812,452 | 9/1998 | Hoang ............ 365/185.11 |
| 5,856,944 | * 1/1999 | Prickett, Jr. et al. ............ 365/185.29 |
| 5,856,946 | 1/1999 | Chan et al. ............ 365/185.19 |
| 5,890,193 | 3/1999 | Chevallier ............ 711/103 |
| 5,901,090 | 5/1999 | Haddad et al. ............ 365/185.29 |
| 5,912,845 | * 6/1999 | Chen et al. ............ 365/183.3 |
| 5,930,174 | 7/1999 | Chen et al. ............ 365/185.29 |
| 6,044,015 | 3/2000 | Van Houdt et al. ............ 365/185.15 |

* cited by examiner

Primary Examiner—Amir Zarabian
Assistant Examiner—Van Thu Nguyen
(74) Attorney, Agent, or Firm—Schwegman, Lundberg, Woessner & Kluth, P.A.

(57) ABSTRACT

A method of soft programming a block of memory cells includes the step of measuring current in a bit line of a column in the block. If the measured bit line current exceeds a predetermined level, memory cells coupled to the bit line are sequentially soft programmed for approximately a predetermined period of time so non-overerased memory cells are undisturbed, and until the measured bit line current is less than or equal to a predetermined level.

25 Claims, 2 Drawing Sheets

METHOD FOR EFFICIENTLY EXECUTING SOFT PROGRAMMING OF A MEMORY BLOCK

FIELD OF THE INVENTION

The present invention relates to operations in flash memory devices. More particularly, the present invention relates to a method and apparatus to diminish undesirable programming in a flash memory device.

BACKGROUND

Flash memory devices have proven to be important memory elements in the past several years, and industry pundits predict an ever-increasing role for such devices in the future. A great advantage flash memory devices have over typical EPROM's and EEPROM's are, respectively, system programmability and lower cost.

Despite the many advantages of flash memories over other memories, flash memory devices have several opportunities for improvement. For example, flash memories in their typical implementations suffer from the problems of "overerased memory cells" and "wild cells" which result in all memory cells not behaving exactly alike with respect to their electrical behavior. In fact, many flash memory devices include wide variations of electrical behavior between adjacent memory cells.

Overerased memory cells are particularly undesirable. Overerased memory cells arise when a block of memory cells is erased. Because of the behavioral dissimilarities of the memory cells within the block, one memory cell typically takes longer to erase than other memory cells. As a result, this memory cell defines the erasure time for all memory cells in the block.

Erasing the block for the defined erasure time results in some memory cells being overerased. Overerased memory cells are memory cells that were erased for an excessive period of time. Overerased memory cells have an undesirable large positive charge on their floating gate. For example, an overerased memory cell will have a floating gate voltage of 3V. A non-overerased memory cell will typically have a floating gate voltage of 0.5V. As a result, overerased memory cells operate in the depletion mode. Hence, overerased memory cells conduct current through a bit line to which they are coupled even when the overerased cells are biased with zero drain voltages.

Thus, selected programmed memory cells, coupled to the same bit line as an overerased memory cell, will appear to draw current and appear to be erased. Therefore, data stored in the flash memory devices may not be accurately read. Therefore, overerased memory cells are preferably corrected.

Typically, overerased memory cells are corrected, by applying a gate voltage of 12 volts to the entire block of memory cells. As the floating gate voltage of such memory cells becomes sufficiently lower to come out of depletion mode. With the gate of the overerased cells sufficiently higher than normally erased cells, the control gate couples the floating gate even higher, through a tunneling mechanism in the channel or source area. Electrons are pulled to the floating gate, and lower the voltage of the floating gate. However, during the aforementioned process, since the procedure affects all of the cells in the block, some non-overerased memory cells become undesirably programmed. Therefore, there is a need to correct overerased memory cells while avoiding undesired programming of non-overerased memory cells.

SUMMARY OF THE INVENTION

The present invention provides a method of soft programming a block of memory cells, including the step of measuring current in a bit line of a column in the block. If the measured bit line current exceeds a predetermined level, memory cells coupled to the bit line are sequentially soft programmed for approximately a predetermined period of time so non-overerased memory cells are undisturbed, and until the measured bit line current is less than or equal to a predetermined level.

In one embodiment, if the measured bit line current is less than the predetermined level, the current in a bit line of the next column in the block is measured. In yet another embodiment, the predetermined level is approximately 10 microamps. In yet a further embodiment, the step of sequentially soft programming comprises the step of applying a gate voltage between approximately 6 and 7 volts, and a drain voltage of approximately 5 volts to a memory cell.

The present invention further provides a method of soft programming a block of memory cells including the step of measuring current in a bit line of a column in the block. If the measured bit line current exceeds a predetermined level, memory cells coupled to the bit line are sequentially soft programmed so nonovererased memory cells are undisturbed until the measured bit line current is less than or equal to a predetermined level.

In another embodiment, the present invention provides a method of programming a block of memory cells arranged in rows and columns, including the step of measuring current in a bit line of a column of the block [step (a)]. If the measured bit line current does not exceed a predetermined level, current in a bit line of a next column of the block is measured [step (b)]. If the measured bit line current does exceed a predetermined level, a first memory cell in the column is soft programmed for a predetermined time [step (c)]. Steps (a)–(c) are repeatably performed except that if in step (c) the measured bit line current exceeds the predetermined level, a next memory cell in the column is soft programmed for the predetermined time [step (d)]. If, after step (d), the last memory cell in the column is reached, steps (a)–(d) are repeated a maximum number of times [step (e)].

In one embodiment, the predetermined level is approximately 10 microamperes. In a further embodiment, the predetermined period of time is approximately 10 milliseconds.

In yet a further embodiment, a method of soft programming a block of memory cells includes the step of measuring current in a bit line of a column in the block. If the measured bit line current exceeds a predetermined level, memory cells coupled to the bit line are sequentially soft programmed so non-overerased memory cells are undisturbed. The memory cells are soft programmed until the measured bit line current is less than or equal to a predetermined level.

It is an advantage of the present invention that it permits overerased cells to be soft programmed for a diminished period of time.

DETAILED DESCRIPTION OF THE PREFERRED EMBODIMENTS

Figure 1:
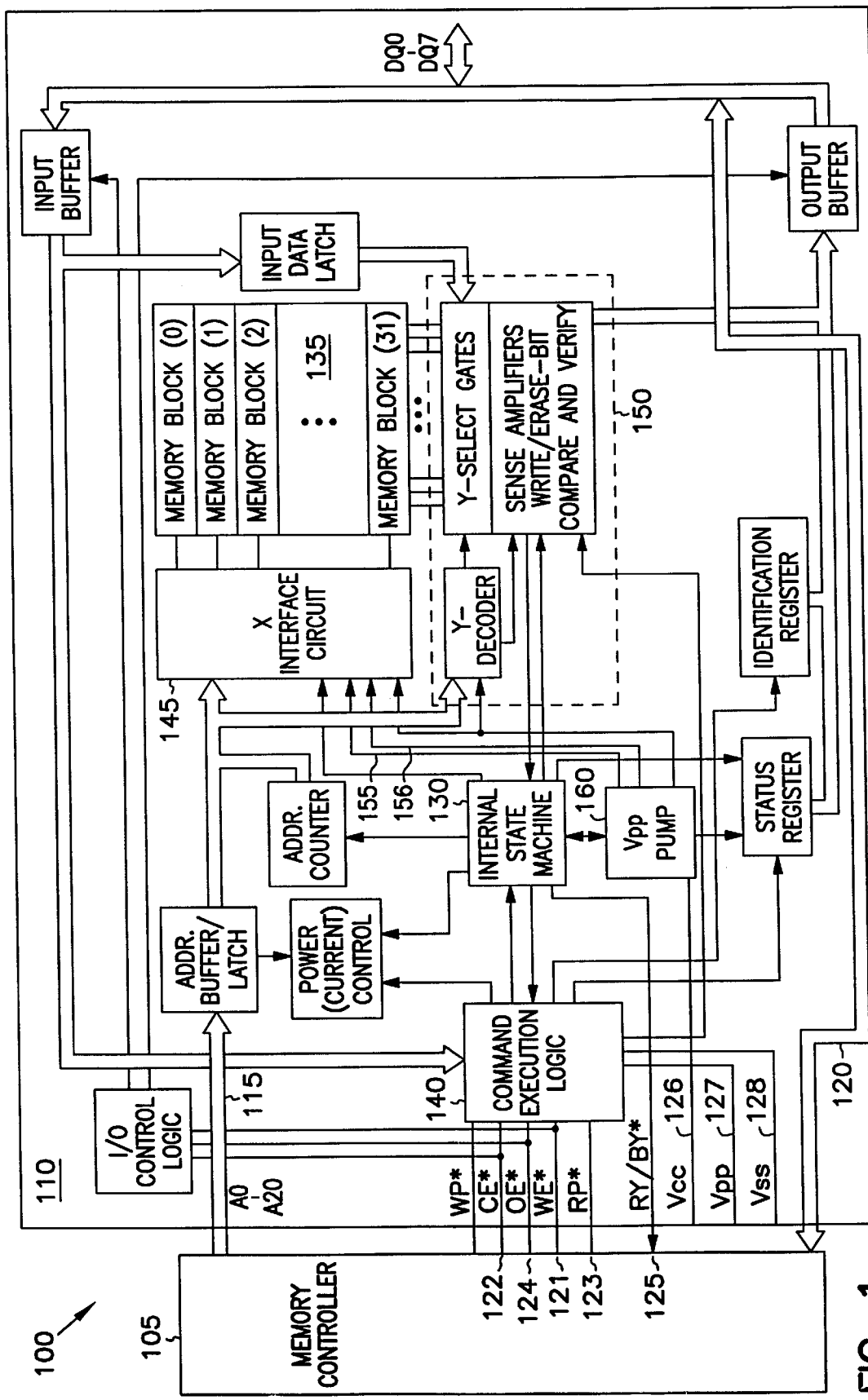
FIG. 1 shows a schematic diagram illustrating generally a memory system embodying features of the present invention.

In the following detailed description, reference is made to the accompanying drawings which form a part hereof, and in which is shown, by way of illustration, specific embodiments in which the invention may be practiced. In the drawings, like numerals describe substantially similar components throughout the several views. The embodiments are described in sufficient detail to enable those skilled in the art to practice the invention. Other embodiments may be used and logical, structural, and electrical changes may be made without departing from the scope of the present invention. The following detailed description is, therefore, not to be taken in a limiting sense, and the scope of the present invention is defined only by the claims and their equivalents.

The present invention provides a method of soft programming overerased cells so that non-overerased cells are not undesirably programmed. In one embodiment, soft programming is accomplished by applying a relatively low gate voltage, of approximately 6 to 7 volts, to memory cells. As a result, non-overerased memory cells are not undesirably programmed, or disturbed, because the relatively lower gate voltage in addition to the relatively low floating gate voltage of the non-overerased cell are insufficient to draw not electrons into the floating gates of the non-overerased memory cells. However, the present invention permits overerased memory cells to be corrected by hot electron injection. This technique can be used in a memory system as described below.

FIG. 1 is a schematic diagram illustrating generally, by way of example, but not by way of limitation, one embodiment of a memory system 100 embodying features of the present invention. Memory system 100 includes memory controller 105 and memory integrated circuit (IC) 110. Controller 105 includes a microprocessor or any other controller providing interface signals to the memory IC 110, as described below. Such interface signals include addressing signals, provided at address lines 115, and data signals, communicated at data lines 120. Other interface signals provided by controller 105 include write enable (WE*) at node 121, chip enable (CE*) at node 122, reset/power-down (RP*) at node 123, and output enable (OE*) at node 124, all of which are active low signals. Memory IC 110 provides a status signal (RY/BY*) at node 125 to controller 105 to indicate the status of internal state machine 130. Memory IC 110 also receives a positive power supply voltage ($V_{cc}$) at node 126 (e.g., approximately 3.3 Volts or approximately 5 Volts), a write/erase supply voltage ($V_{pp}$) at node 127 (e.g., approximately 5 Volts), and a reference voltage such as substrate ground voltage ($V_{ss}$) at node 128 (e.g., approximately 0 Volts).

In the embodiment of FIG. 1, memory IC 110 includes a memory cell array 135 of floating gate transistor memory cells arranged in 32 memory cell blocks. Each memory cell block in memory cell array 135 contains 64 kilobytes of floating gate transistor memory cells. Data stored in each memory cell block is erased independently, as described below, without disturbing data stored in other memory cell blocks. A command execution logic module 140 receives the above-described interface signals from controller 105. The command execution logic module 140 controls an internal state machine 130, which provides write and block erase timing sequences to memory cell array 135 through X-interface circuit 145 and Y-interface circuit 150.

Y-interface circuit 150 provides access to individual memory cells through bit lines in memory cell array 135. Y-interface circuit 150 includes a Y-decoder circuit, Y-select gates, sense-amplifiers, and write/erase bit compare and verify circuits. X-interface circuit 145 provides access to rows of memory cells through wordlines in memory cell array 135, which are electrically coupled to control gates (also called select gates) of floating gate transistors in memory cell array 135. X-interface circuit 145 includes decoding and control circuits for erasing individual blocks of memory cells in memory cell array 135.

Figure 2:
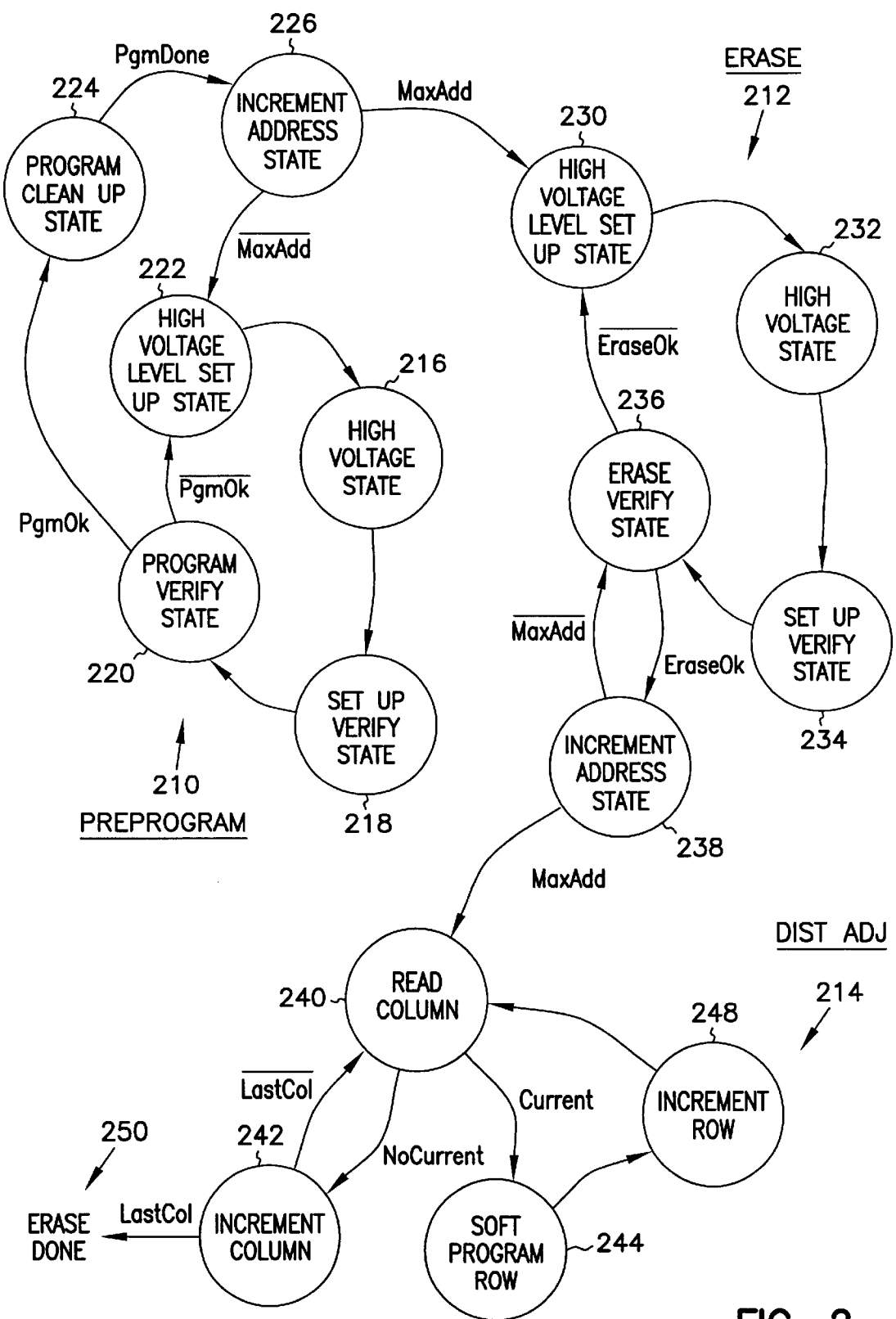
FIG. 2 shows a state diagram of an erase operation for use with a state machine.

FIG. 2 shows a state diagram, of the state machine 130, for controlling an erase operation in a flash memory. Another state machine is described in U.S. Pat. No. 5,619,453, which is hereby incorporated by reference for its description of the state diagram therein. The state diagram includes a plurality of interconnected execution cycles including incremental cycles and other cycles. The execution cycles of the erase operation are arranged in a plurality of interconnected groups, including a pre-program group 210, an erase group 212, and a distribution adjustment group 214 connected together in the order shown. In order to erase a block of flash memory, the state machine 130 executes the cycles in the interconnected groups.

The pre-program group 210 includes a plurality of interconnected execution cycles including incremental cycles and other cycles. As shown in FIG. 2, the pre-program group includes a high voltage state 216 connected to a setup verify state 218. The setup verify state 218 is connected to a program verify state 220. If the program verify state 220 determines that the program is not in order, the operation jumps to a high voltage level setup state 222. The high voltage level setup state 222 is connected back to the high voltage state 216. If the program verify state 220 determines that the operation is indeed in order, the operation jumps to a program cleanup state 224. The above described states are designated as other cycles, as opposed to incremental cycles described below.

The program clean up state 224 jumps to an increment address state 226 when the operation has completed the program for a given address. The increment address state 226 is designated as an incremental cycle because it adjusts a variable, determines if the adjusted variable is a predefined stopping point, and, if so, proceeds with the operation. If not, the incremental cycle sends the operation back into another loop, as appreciated by those skilled in the art. With regard to the increment address state 226, the operation increases the address variable and compares it to a predetermined maximum address. If the variable is at the maximum address, the operation proceeds to the erase group 212 of cycles. If not, the operation jumps back to the high voltage level setup state 222 and repeats the cycles in the pre-program group 210.

The erase group 212 also includes a plurality of cycles including incremental cycles and other cycles. The initial cycle in the erase group 212 is a high voltage level setup state 230 which takes approximately 400 nanoseconds to complete. The high voltage level setup state 230 then jumps to a high voltage state 232 which takes approximately 10 milliseconds to complete.

In one embodiment of the present invention, a block of memory cells is erased during the high voltage state 232. In another embodiment, the block of memory cells is erased by applying a gate voltage of approximately −10 to −11 volts to the memory cells. By Fowler-Nordheim tunneling, electrons are drawn from the floating gates into the sources of the memory cells. In this state, some memory cells become overerased and have a floating gate biased with a net positive voltage. As described above, the net positive voltage causes the overerased memory cells to become normally conductive. Therefore, the present invention provides a method for soft programming a block of memory cells to correct overerasures, as subsequently described.

The next cycle is the setup verify state 234, which takes approximately 5 microseconds to complete. The erase verify state 236 follows the setup verify state 234 and takes approximately 200 nanoseconds to complete. The above described cycles of the erase group 212 are know as other cycles, again as opposed to increment cycles. If the erase verify state 236 determines that the erase operation is complete, the operation jumps to an increment address state 238 which is an increment cycle.

The increment address state 238 of the erase group 212 is designated as an incremental cycle because, like the increment address state 226 of the pre-program group 210, it adjusts a variable, determines if the adjusted variable is a predefined stopping point, and, if so, proceeds with the operation. If not, the incremental cycle sends the operation back into another loop. With regard to the increment address state 238 of the erase group 212, the operation increases the address variable and compares it to a predetermined maximum address. If the variable is at the maximum address, the operation proceeds to distribution adjustment group 214 of cycles. If not, the operation jumps back to the erase verify state 236.

The distribution adjustment group 214 includes a plurality of other cycles. The erase group 212 jumps to the read column state 240 of the distribution adjustment group 214. Upon commencing the read column state 240, the first column is selected. This read operation is performed with no rows selected. If the read column state 240 ascertains that no memory cells in the selected column are overerased then the operation jumps to the increment column state 242 which selects the next column. Subsequently, the operation jumps back to the read column state 240, until the last column is selected. After the last column is selected, the operation proceeds to the erase done group 250.

However, if the read column state 240 ascertains that one or more memory cells in the selected column are overerased, then the operation jumps from the read column state 240 to soft program row state 244.

Upon commencing the soft program row state 244 in this manner, the memory cell in the first row of the selected column is selected. The memory cell in selected row is then soft programmed to correct the memory cell if it is overerased. The operation then jumps to the increment row state 248 which selects the memory cell in a subsequent row. Then, the operation jumps to the read column state 240 to ascertain whether any memory cells in the selected column remain overerased. If no memory cells remain overerased, then the operation jumps to the increment column state 242, and proceeds as described above.

However, if memory cells remain overerased, the operation sequentially jumps to the soft program row state 244 and then the increment row state 248, as described above. As a result, subsequent rows are soft programmed, even repeatedly, until either the read column state 240 ascertains that no overerased cells remain in the column, or until each memory cell is soft programmed a maximum number of times.

One embodiment of soft programming according to the present invention will now be described. First, during the read column state 240, a column of memory cells is read, with all memory cells biased off, by measuring current in a corresponding bit line. Each column includes a bit line to which memory cells are coupled. The memory cells are biased off by applying a gate voltage of zero volts to each memory cell coupled to the bit line. If the current does not exceed approximately a predetermined level, the next column is read during the increment column state 242. The predetermined level is a current level, for example, approximately between 10 and 12 microamps, which would not mask, and hence permits, an accurate reading of a programmed memory cell.

If the bit line current exceeds the predetermined level, then memory cells in the column are soft programmed, in the soft program row state 244 in the manner described below, until the bit line current does not exceed the predetermined level.

A memory cell is soft programmed during the soft program row state 240 by biasing the selected memory cell with a gate voltage of between approximately 6 and 7 volts, and a drain voltage of approximately 5 volts for approximately 100 microseconds. Typically, even the most overerased memory cells are corrected by applying this bias for such a time period. After soft programming the selected memory cell, the bit line current is measured again during the read column state 240. If the current is below the predetermined level, then the next column is analyzed during the read column state 240 after performing the increment column state 240. However, if the bit line current still exceeds the predetermined level, subsequent memory cells in the column are sequentially soft programmed as described above until the measured current is less than the predetermined level. Again, each bit line in a block of flash memory cells is measured during the read column state 240, and if necessary, soft programmed as described above. In one embodiment, each memory cell coupled to a bit line is soft programmed a maximum of one time. In another embodiment, the foregoing technique can be used to soft program a single memory cell.

This method effectively eliminates overerasures. However, numerous nonovererased memory cells may precede the overerased memory cells in a column. Thus, execution of the distribution adjustment group 214 may take a long time, for example, approximately at least two seconds. Such a lengthy process is undesirable in many systems incorporating flash memory devices. Therefore, there is a further need to diminish the performance time of the distribution adjustment group 214.

An alternative embodiment of the present invention provides a faster method of soft programming. The alternative method of soft programmning differs from the first method in that each memory cell is soft programmed during the soft program row state 240 for a relatively shorter predetermined period of time, such as equal to or less than approximately 10, 25 or 50 microseconds, which is substantially less time than required to correct an average overerased memory cell. After each memory cell is soft programmed, the column current is measured. If the column current is below the predetermined level, then the next column is analyzed. However, if the current still exceeds the predetermined level, the subsequent memory cell in the column is soft programmed as described above. If the last memory cell in the column is soft programmed, and the measured current still exceeds the predetermined level, then the foregoing process is repeated such that the first and subsequent memory cells in the column are soft programmed until the measured current is less than the predetermined level, or until each memory cell in the column has been soft programmed a maximum number, for example 10 or 32, of times. If the memory cells in a column have been soft programmed a maximum number of times, and the corresponding measured bit line current still exceeds the predetermined level, then a status register in the memory 110 is set and the memory fails soft programming.

The alternative embodiment of the method of soft programming has the benefit that the overerased cells are soft programmed for a diminished period of time. Thus, the speed of operation of the flash memory is enhanced. Furthermore, the disturbance of non-overerased cells is also diminished.

It is to be understood that the above description is intended to be illustrative, and not restrictive. Many other embodiments will be apparent to those of skill in the art upon reviewing the above description. The invention should, therefore, be determined with reference to the appended claims, along with the full scope to which such claims are entitled.

What is claimed is:

1. A method of soft programming a block of memory cells, comprising:

measuring a leakage current in a bit line of a column in the block without accessing any memory cells in the column to produce a measured bit line leakage current; and if the measured bit line leakage current exceeds a predetermined current level, sequentially soft programming each of the memory cells coupled to the bit line for approximately a predetermined period of time so non-over erased memory cells are undisturbed, and until the measured bit line leakage current is less than or equal to the predetermined current level, wherein soft programming comprises applying fixed repair voltages to a source, a drain and a control gate of the memory cells, the predetermined period of time is less than 100 microseconds and is substantially less than a time period required to repair an average over erased memory cell.

2. The method of claim 1, wherein if the measured bit line leakage current is less than the predetermined current level, measuring current in a bit line of the next column in the block.

3. The method of claim 1, wherein the predetermined current level is approximately 10 microamps.

4. The method of claim 1, wherein sequentially soft programming comprises soft programming each memory cell, coupled to the bit line, a maximum number of times.

5. The method of claim 4, wherein the maximum number of times is equal to 32.

6. The method of claim 1, wherein the predetermined period of time is approximately 10 milliseconds.

7. The method of claim 1, wherein the predetermined period of time is approximately 25 milliseconds.

8. The method of claim 1, wherein the predetermined period of time is approximately 50 milliseconds.

9. A method of programming a block of memory cells arranged in rows and columns, comprising:

(a) measuring leakage current in a first bit line of a first column of the block without accessing any memory cells in the first column to produce a measured first bit line leakage current;

(b) if the measured first bit line leakage current does not exceed a predetermined current level, measuring leakage current in a second bit line of a second column of the block;

(c) if the measured first bit line leakage current does exceed a predetermined current level, soft programming each memory cell located in the first column for a predetermined time period, wherein soft programming comprises applying fixed repair voltages to a source, a drain and a control gate of the memory cells, the predetermined period of time is less than 100 microseconds and is substantially less than a time period required to repair an average over erased memory cell;

(d) repeatedly performing (a)–(c), except that if in (c) the measured first bit line leakage current exceeds the predetermined current level, soft programming a next memory cell in the column for the predetermined time; and (e) if, after (d), the last memory cell in the column is reached, repeating (a)–(d) a maximum number of times.

10. The method of claim 9, wherein the predetermined current level is approximately 10 microamperes.

11. The method of claim 9, wherein the predetermined period of time is approximately 10 milliseconds.

12. The method of claim 9, wherein the predetermined period of time is approximately 25 milliseconds.

13. The method of claim 9, wherein the predetermined period of time is approximately 50 milliseconds.

14. The method of claim 9, wherein the maximum number of times is equal to 32.

15. The method of claim 9, wherein the maximum number of times is equal to 10.

16. The method of claim 9, wherein if memory cells in a column have been soft programmed a maximum number of times, and the corresponding measured bit line current still exceeds the predetermined level, setting a status register in a memory device containing the block of memory cells.

17. The method of claim 9, wherein if memory cells in a column have been soft programmed a maximum number of times, and the corresponding measured bit line current still exceeds the predetermined level, setting a status register in a memory device containing the block of memory cells, and failing the memory device.

18. A method of soft programming a block of memory cells, comprising:

measuring current in a bit line of a column in the block without accessing any memory cells in the column to produce a measured bit line current; and if the measured bit line current exceeds a predetermined current level, sequentially soft programming memory cells coupled to the bit line so non-over erased memory cells are undisturbed, and until the measured bit line current is less than or equal to the predetermined current level, wherein soft programming comprises applying fixed repair voltages to a source, a drain and a control gate of the memory cells, the predetermined period of time is less than 100 microseconds and is substantially less than a time period required to repair an average over erased memory cell.

19. The method of claim 18, wherein sequentially soft programming comprises soft programming a memory cell of the block of memory cells that is coupled to the bit line for approximately 50 microseconds.

20. The method of claim 18, wherein the predetermined current level is 10 microamps.

21. The method of claim 18, wherein sequentially soft programming comprises soft programming each memory cell a maximum of one time.

22. A method of erasing a memory cell, comprising:

erasing a memory cells;

measuring a leakage current in a column containing the memory cells to produce a measured leakage current;

if the measured leakage current exceeds a predetermined level, soft programming each of the memory cells by applying appropriate voltages to a gate and drain of the memory cells for a time period of less than 100 microseconds, and wherein soft programming further comprises applying a gate voltage and a drain voltage to the memory cells; and measuring the leakage current after soft programming each memory cell in the column to determine if the leakage current is below the predetermined level.

23. A method of erasing a memory cell, comprising:

erasing a memory cell among a plurality of memory cells in a column;

measuring a leakage current in the memory cell to produce a measured leakage current;

if the measured leakage current exceeds a predetermined level, sequentially soft programming each of the memory cells by applying appropriate voltages to a gate and drain of the memory cells for a time period of less than 50 microseconds, wherein soft programming comprises applying a gate voltage and a drain voltage of to the memory cells; and measuring the leakage current after all of the memory cells in the column are soft programming to determine if the leakage current is below the predetermined level.

24. A method of erasing a memory cell, comprising:

erasing a memory cell among a plurality of memory cells in a column;

measuring a leakage current in the memory cell to produce a measured leakage current;

if the measured leakage current exceeds a predetermined level, sequentially soft programming each of the memory cells by applying appropriate voltages to a gate and drain of the memory cells for a time period of about 25 microseconds, wherein soft programming comprises applying a gate voltage and a drain voltage of the memory cells; and measuring the leakage current after all of the memory cells in the column are soft programming to determine if the leakage current is below the predetermined level.

25. A method of erasing a memory cell, comprising:

erasing a memory cell among a plurality of memory cells in a column;

measuring a leakage current in the memory cell to produce a measured leakage current;

if the measured leakage current exceeds a predetermined level, sequentially soft programming each of the memory cells by applying appropriate voltages to a gate and drain of the memory cells for a time period of about 10 microseconds, wherein soft programming comprises applying a gate voltage and a drain voltage of the memory cells; and measuring the leakage current after all of the memory cells in the column are soft programming to determine if the leakage current is below the predetermined level.

* * * * *